(12) United States Patent
Mohammed

(10) Patent No.: US 12,663,469 B2
(45) Date of Patent: Jun. 23, 2026

(54) INTEGRATED-CIRCUIT CHIP FOR RETENTION CELL TESTING

(71) Applicant: Nordic Semiconductor ASA, Trondheim (NO)

(72) Inventor: Ashraf Mohammed, Trondheim (NO)

(73) Assignee: Nordic Semiconductor ASA, Trondheim (NO)

( * ) Notice: Subject to any disclaimer, the term of this patent is extended or adjusted under 35 U.S.C. 154(b) by 17 days.

(21) Appl. No.: 18/740,412

(22) Filed: Jun. 11, 2024

(65) Prior Publication Data

US 2024/0418776 A1 Dec. 19, 2024

(30) Foreign Application Priority Data

Jun. 14, 2023 (GB) ..................................... 2308912

(51) Int. Cl.
 *G01R 31/3185* (2006.01)
 *G01R 31/3183* (2006.01)
(52) U.S. Cl.
 CPC ............... *G01R 31/318552* (2013.01); *G01R 31/318307* (2013.01); *G01R 31/318536* (2013.01); *G01R 31/318541* (2013.01)
(58) Field of Classification Search
 CPC .... G01R 31/318552; G01R 31/318307; G01R 31/318536; G01R 31/318541
 USPC ......................................... 714/726, 729, 731
 See application file for complete search history.

(56) References Cited

U.S. PATENT DOCUMENTS

| | | | | |
|---|---|---|---|---|
| 8,296,703 | B1 * | 10/2012 | Chakravadhanula | ........................ G11C 29/56008 716/112 |
| 9,805,826 | B2 * | 10/2017 | Sang | ...................... G11C 29/32 |
| 10,222,421 | B1 * | 3/2019 | Srivastava | ..... G01R 31/318544 |
| 2003/0188241 | A1 * | 10/2003 | Zyuban | ............ G01R 31/31721 714/726 |
| 2008/0115024 | A1 | 5/2008 | Wang et al. | |
| 2009/0326854 | A1 | 12/2009 | Chakravadhanula et al. | |
| 2011/0248759 | A1 * | 10/2011 | Chi | .................. H03K 3/356008 327/202 |
| 2016/0232968 | A1 * | 8/2016 | August | ................. G11C 11/161 |
| 2024/0103079 | A1 * | 3/2024 | Kandula | ........ G01R 31/318544 |
| 2024/0418776 | A1 * | 12/2024 | Mohammed | ... G01R 31/318536 |

OTHER PUBLICATIONS

Hsu et al., Testing Retention Flip-flops in Power-gated Designs, 2013, IEEE, pp. 1-6. (Year: 2013).*

(Continued)

*Primary Examiner* — John J Tabone, Jr.
(74) *Attorney, Agent, or Firm* — Klarquist Sparkman, LLP

(57) ABSTRACT

An integrated-circuit chip comprises a plurality of scan flip-flops and a retention cell. The chip is configured to have a scan-capture mode, in which the plurality of scan flip-flops and the retention cell are connected to respective functional circuitry of the integrated-circuit chip, and to have a scan-shift mode, in which the plurality of scan flip-flops and the retention cell are connected so as to form a scan chain for use during scan-chain testing of the integrated-circuit chip. The chip further comprises on-chip test circuitry arranged to generate and output a save signal, a clock signal, and a restore signal to the retention cell, for testing the retention cell during scan-chain testing of the integrated-circuit chip.

20 Claims, 5 Drawing Sheets

(56)                    References Cited

OTHER PUBLICATIONS

Chakravadhanula, et al., Test Generation for State Retention Logic, 2008, IEEE, pp. 237-242. (Year: 2008).*

Bai et al., Fault Modeling and Testing of Retention Flip-Flops in Low Power Designs, 2009, IEEE, pp. 684-689. (Year: 2009).*

Raghu-Aravinda, Going Green with Low Power Methodology, May 4, 2008, astep-to-lowpower.blogspot.com, pp. 1-2. (Year: 2008).*

Cao et al., "A Bypassable Scan Flip-Flop for Low Power Testing with Data Retentioin Capability," *IEEE Transactions on Circuits and Systems II: Express Briefs*, vol. 69, No. 2, pp. 554-558, Feb. 2022.

Giles et al., "Built-In Constraint Resolution," https://www.researchgate.netpublication/4217720, 11 pp, Dec. 2005.

Sejwal et al., "CRecSys: A Context-Based Recommender System Using Collaborative Filtering and LOD," *IEEEAccess*, vol. 8, Aug. 27, 2020.

Hsu et al., "Testing Retention Flip-flops in Power-gated Designs," *IEEE 31st VLSI Test Symposium* (*VTS*), 6 pp. (downloaded on Apr. 4, 2023).

Combined Search and Examination Report under Sections 17 and 18(3) for Application No. GB2308912.1, 6 pp., Nov. 22, 2023.

\* cited by examiner

INTEGRATED-CIRCUIT CHIP FOR RETENTION CELL TESTING

CROSS REFERENCE TO RELATED APPLICATION

This application claims priority from Great Britain Application No. 2308912.1, filed Jun. 14, 2023, which application is incorporated herein by reference in its entirety.

TECHNICAL FIELD

This invention relates to an integrated-circuit chip configured for scan-chain testing of the chip.

BACKGROUND OF THE INVENTION

During production, integrated circuit chips are usually tested for defects. Such testing is typically performed using off-chip automatic test equipment and may be carried out using wafer probing before packaging and on chips after packaging. Some chips support scan-chain testing by being configured to operate in a scan mode in which flip-flops on the chip are disconnected from the functional circuitry of the chip that they communicate with during normal operation and are instead connected sequentially to form one or more scan chains. Flip-flops that can be tested in this way are referred to as scan flip-flops and have a respective multiplexer at the data input of each flip-flop. Each multiplexer has a first "functional" input that is connected to respective functional circuitry and a second "scan" input that is connected to the data output of a respective preceding flip-flop in the scan chain (or to a scan data input pin of the chip, in the case of the first flip-flop of the chain). The multiplexers are switched from a functional mode to the scan mode, in which the flip-flops are coupled in a scan chain, when a SCAN_ENABLE signal is asserted. The SCAN_ENABLE signal may be received from the off-chip test equipment at a SCAN_ENABLE pin.

When connected in a scan chain, a test vector of bit values can be loaded to the scan flip-flops by the off-chip test equipment, during a scan-in process, by clocking the data along the chain, with the scan flip-flops operating like a shift register. This allows the bit value of each of the scan flip-flops to be set to a desired value, by asserting SCAN_ENABLE and loading a known sequence, e.g. 0011001100110011 . . . , through the scan data input pin. Once the values have been loaded to the scan flip-flops, the SCAN_ENABLE signal is de-asserted and a single "capture" clock pulse is issued during a scan-capture process, causing the scan flip-flops to be reconnected to, and capture data from, their respective functional circuitry. The SCAN_ENABLE signal is then re-asserted by the off-chip test tool and, in a scan-out process, the values held on each flip-flop of the scan chain are clocked out as a result vector to the off-chip test equipment, through a scan-output pin, which is connected to an end flip-flop in the scan chain. By comparing the output values to the known input sequence, a determination can be made as to whether the flip-flops and associated circuitry are functioning correctly. The test vector may be generated using automatic test pattern generation (ATPG) techniques for effectively detecting various types of manufacturing defect (e.g. stuck-at faults).

Retention cells (also referred to as retention flip-flops or retention registers) are specially-modified flip-flops that can be used to retain data when power gating a portion of an integrated-circuit chip. A balloon-type retention cell has a principal latch or flip-flop (e.g. a D-type flip-flop) in a first power domain and a balloon latch in a second power domain that remains active even when the first power domain is turned off—e.g. an always-on power domain. By sending appropriate control signals to the retention cell, it can be controlled to save the state of the principal flip-flop to the balloon latch before the first power domain is switched off, and then to restore the state to the principal flip-flop after power-up using the value held in the balloon latch. Including retention cells within a portion of a chip can allow that portion to be powered down without losing important data or state information. Some designs of retention cell have separate "save" and "restore" input lines, while other designs have a single combined "save"/"restore" input line.

Existing ATPG-based test tools are unable to automatically test the retention operation of retention cells during scan-chain testing (i.e. to test that the save and restore function of a retention cell is working correctly). An improved approach for testing retention cells in integrated-circuit chips is therefore desired.

SUMMARY OF THE INVENTION

From a first aspect, the invention provides an integrated-circuit chip comprising:

a plurality of scan flip-flops; and a retention cell;

wherein the integrated-circuit chip is configured to have a scan-capture mode, in which the plurality of scan flip-flops and the retention cell are connected to respective functional circuitry of the integrated-circuit chip, and to have a scan-shift mode, in which the plurality of scan flip-flops and the retention cell are connected so as to form a scan chain for use during scan-chain testing of the integrated-circuit chip; and wherein the integrated-circuit chip further comprises on-chip test circuitry arranged to generate and output a save signal, a clock signal, and a restore signal to the retention cell, for testing the retention cell during scan-chain testing of the integrated-circuit chip.

From a second aspect, the invention provides a method of operating an integrated-circuit chip, wherein the integrated-circuit chip comprises:

a plurality of scan flip-flops;

a retention cell; and on-chip test circuitry configured to generate and output save, clock and restore signals to the retention cell, the method comprising, during a scan-chain testing of the integrated-circuit chip:

operating the integrated-circuit chip in a scan-shift mode, in which the plurality of scan flip-flops and the retention cell are connected so as to form a scan chain;

operating the integrated-circuit chip in a scan-capture mode, in which the plurality of scan flip-flops and the retention cell are connected to respective functional circuitry of the integrated-circuit chip; and using the on-chip test circuitry to generate and output a save signal, a clock signal and a restore signal to the retention cell.

Thus, it will be seen that on-chip circuitry can generate and output save, clock and restore signals to a retention cell, thereby allowing the retention cell to be tested as part of a scan chain that also includes other flip-flops that do not support retention. The ability to connect the retention cell to the scan flip-flops in a common scan chain, and the ability to generate save, clock and restore signals with appropriate timings on the chip, can enable the save and restore operations of the retention cell to be tested within a same scan-chain test process as some or all of the scan flip-flops.

The scan-chain testing may comprise automatic test pattern generation (ATPG)-based testing. The integrated-circuit (IC) chip may be configured to receive a test data (e.g. a test vector) from outside the chip (e.g. through a scan-input pin) and to load the test data to the plurality of scan flip-flops and the retention cell. It may be configured to receive the test data from off-chip test equipment. The test data may be loaded in a scan-in operation; this may be done with the chip in the scan-shift mode. The chip may be configured to read result data (e.g. a result vector) from the plurality of scan flip-flops and the retention cell and to output the result data from the chip (e.g. through a scan-output pin); this may be done with the chip again in the scan-shift mode. The chip may be configured to output the result data to off-chip test equipment.

The IC chip may be configured to connect the plurality of scan flip-flops and the retention cell to respective functional circuitry such that they do not form a scan chain when the chip is in the scan-capture mode. The IC chip may be configured to output the save, clock and restore signals from the on-chip test circuitry to the retention cell when the IC chip is in the scan-capture mode.

The method may comprise, during the scan-chain testing:

with the chip in the scan-shift mode, loading test data to the plurality of scan flip-flops and the retention cell;

then, with the chip in the scan-capture mode, using the on-chip test circuitry to output the save, clock and restore signals to the retention cell; and then, with the chip in the scan-shift mode, reading result data from the plurality of scan flip-flops and the retention cell.

The retention cell may comprise a principal latch and a retention latch, wherein the principal latch and the retention latch are in different respective power domains. In some embodiments, the principal latch is provided by a D-type flip-flop and the retention latch is a balloon latch. The principal latch may be connected to functional circuitry of the integrated circuit-chip in the scan-capture mode. The retention latch may be arranged to store data (e.g. a stored bit) when the principal flip-flop is unpowered. The retention latch may be configured to retain a bit value representative of a state of the principal flip-flop of the retention cell, e.g. a value held by the principal flip-flop when it last had power.

The retention cell may be configured to store a value from the principal latch to the retention latch in response to receiving save signals (which can include the save signal output by the test circuitry) at a save input of the retention cell. The save signal may comprise an edge or a pulse received over a save line. The retention cell may be configured to restore a value from the retention latch to the principal latch in response to receiving restore signals (which can include the restore signal output by the test circuitry) at a restore input of the retention cell. The restore signal may comprise an edge or a pulse received over a restore line. The retention cell may be configured to set or reset the principal latch in dependence on a value stored in the retention latch upon receiving the restore signal. The retention cell may be configured to receive a clock signal (which may include the clock signal output by the test circuitry) at a clock input. The retention cell may be arranged to receive a value into the principal latch from the scan chain upon receiving a clock pulse when in the scan-shift mode, and to receive a value into the principal latch from functional circuitry of the IC chip upon receiving a clock pulse when in the scan-capture mode.

Although the save input and restore input could, in some embodiments, be a single input with the save and restore signal being received over a single line (e.g. as an assertion and a deassertion respectively), in preferred embodiments the save and restore input are two distinct respective inputs to the retention cell—e.g. with the retention cell being a dual-pin balloon-latch retention cell. The save line and restore line are preferably different respective lines, extending at least from the test circuitry to the retention cell. The save and restore signals may be respective pulses on the save line and restore line. The clock link may be a further line, extending at least from the test circuitry to the retention cell.

The IC chip may comprise a scan-enable pin for receiving a scan-enable signal from off-chip test equipment. It may be configured to switch between the scan-shift mode and the scan-capture mode at least partly in dependence on a state of the scan-enable pin (e.g. a high or low state).

The test circuitry may be configured to output the save signal, then the clock signal, then the restore signal, to the retention cell (i.e. in this order). Each of the save, clock and restore signals may comprise a respective pulse (i.e. a save pulse, a clock pulse, and a restore pulse). In particular, the clock signal may be a single pulse, which may act as a capture pulse for the plurality of scan flip-flops. The clock pulse may cause the retention cell to clock a value into the principal latch from functional circuitry to which the retention cell is connected in the scan-capture mode. The three pulses are preferably non-overlapping in time. The test circuitry may be configured to generate and output the signals such that a rising edge of the clock signal is spaced apart after a falling edge of the save signal, and a rising edge of the restore signal is spaced apart from a falling edge of the clock signal. It may be configured to output the save, clock and restore signals when the chip is in the scan-capture mode. It may output the signals in response to the chip switching from the scan-shift mode to the scan-capture mode during scan-chain testing—e.g. after the end of a scan-in process in which test data is loaded to the scan flip-flops and the principal latch of the retention cell.

The clock signal from the test circuitry may cause the principal latch of the retention cell to receive a value from one or more components of the functional circuitry, which may include from one or more of the scan flip-flops. The retention cell may be arranged, when in the scan-capture mode, to receive a value that is, or that depends on, a value stored in a scan flip-flop of the plurality of scan flip-flops. This can facilitate efficient testing of the restore function of the retention cell by enabling a test vector to clock a first bit value into the retention cell during scan-in (e.g. in the scan-shift mode) and an opposite bit into a corresponding scan flip-flop; then, in the scan-capture mode, the first value can be saved to the retention latch (by the save pulse), then an opposite bit value can be clocked into the principal latch (by the clock pulse issued in the scan-capture process), before the first bit value is restored to the principal latch (by the restore pulse). Then, after scan-out (during which the IC chip may also be in the scan-shift mode), a failed restore can then easily be detected from the value clocked out of the retention cell because a failed restore will leave the opposite bit value, rather than the restored first value, in the principal latch after the restore.

In some embodiments, the chip may comprise an on-chip clock controller, configured to generate a local clock signal for use by the on-chip test circuitry when generating the clock signal for output to the retention cell. The local clock signal may be a square wave signal. The square wave signal may comprise a plurality of square wave pulses, which may be arranged in groups, wherein each group contains one or more square wave pulses (e.g. four clock pulses) having a clock cycle, and wherein the groups are separated in time from each other by a duration longer than this clock cycle. The on-chip test circuitry may be arranged to receive the local clock signal from the on-chip clock controller and to derive (i.e. generate) the aforesaid clock signal from the local clock signal for output to the retention cell, e.g. by selectively gating the local clock signal. The on-chip test circuitry may be configured to output a first clock signal (e.g. a single clock pulse) to the retention cell when in the scan-capture mode during scan-chain testing, and to output further clock signals (e.g. regular clock pulses) to the retention cell when in the scan-shift mode (e.g. during scan-in and scan-out processes).

The on-chip test circuitry may be configured to use the local clock signal to synchronize (e.g. determine the order and timing of) the save, clock and restore signals output to the retention cell. It may comprise a plurality of delay flip-flops (e.g. four flip-flops) arranged in a chain for controlling the timing of the save, clock and restore signals.

The on-chip test circuitry may comprise a first flip-flop (e.g. D-type flip-flop) arranged to receive a test-enable signal at its data input, and to provide an output signal to a first input of a first logic gate. The test-enable signal may be received from test-enable circuitry of the integrated circuit chip. The first logic gate may be an XOR gate arranged to receive the test-enable signal at its second input. By providing an XOR gate arranged to receive a test-enable signal at one input (the second input), and the output of the first flip-flop at its first input, a signal may be generated that is high when the test-enable signal is received from the test-enable circuitry, but which becomes low after a next clock pulse is received by the first flip-flop (e.g. from the on-chip clock controller).

The test circuitry may comprise a second logic gate, arranged to output the save signal to the retention cell. The second logic gate may be an AND gate arranged to receive a test-enable signal at a first input. The AND gate may be configured to receive the output of the first logic gate at its second input. This may allow the second logic gate to generate a save signal in the form of a square wave pulse.

The test circuitry may comprise a second delay flip-flop configured to receive an input signal from the first logic gate, and to provide an output signal to a first input of a third logic gate. The third logic gate may be an OR gate configured to receive the inverse of the enable signal at a second input. The third logic gate may be arranged to generate a clock-enable signal for output to a capture clock pulse component. The capture clock pulse component may be arranged to output the aforesaid clock signal (e.g. a single pulse) to the retention cell.

The output of the second delay flip-flop may be provided to a third delay flip-flop. The third delay flip-flop may be arranged to provide an output to a fourth delay flip-flop. The fourth delay flip-flop may be configured to output to a first input to a fourth logic gate in response to receiving an input from the third delay flip-flop. However in some embodiments, the third delay flip-flop may be configured to output to the first input of the fourth logic gate directly. A second input of the fourth logic gate may be arranged to receive the enable signal. The fourth logic gate may be an AND gate. The fourth logic gate may be arranged to output the restore signal to the retention cell in response to receiving the enable signal and the output from the third delay flip-flop or fourth delay flip-flop.

The integrated circuit may comprise test-enable circuitry configured to generate a test-enable signal for indicating that retention testing is to be performed during scan-chain testing. The test-enable circuitry may be configured to output the test-enable signal at least partly in response to a signal received from outside the chip (e.g. from the off-chip testing tool), which may be received over a test access port and/or as a control bit within test data received at a scan-input pin of the chip). The test-enable circuitry may comprise a control-bit scan flip-flop arranged to be part of the scan chain in the scan-shift mode. It may be at one end of the scan chain, and may be configured to output data values to the plurality of scan flip-flops and the retention cell in the scan-shift mode. The chip may be arranged to determine whether to issue the save and restore signals (i.e. whether to perform retention testing) at least partly in dependence on a value stored in the control-bit scan flip-flop. This can allow the retention testing to be conveniently turned on or off for any particular test vector, by including an appropriate control bit value in the test vector.

The retention cell may be at an end of the scan chain. In some embodiments, the integrated circuit may comprise a plurality of retention cells, each arranged to receive the save, clock and restore signals from the on-chip test circuitry. The plurality of retention cells may be connected in sequence at the end of the scan chain, or may be located at other positions along the scan chain. Thus, a single scan chain of flip-flops may be formed, for scan-chain testing, comprising the plurality of scan flip-flops and a plurality of retention cells.

In some embodiments, the aforesaid retention cell may be a balloon-latch retention cell, and the IC chip may additionally comprise one or more master-slave retention cells (i.e. cells that have the master latch of a master-slave D-type flip-flop as a principal latch and the slave latch of the master-slave D-type flip-flop as a retention latch). These which may be connected to the scan chain in the scan-shift mode. Each such master-slave retention cell may comprise a single input (e.g. a RETN or SLEEP input) for receiving a retention signal from the test circuitry. The test circuitry may be configured to output a retention signal to each such master-slave retention cell.

The scan chain may be a single chain or it may comprise a plurality of sub-chains. The chip may comprise a scan-chain decompressor for loading test data to a plurality of sub-chains. The chip may comprise further scan flip-flops and/or one or more further scan chains.

Features of any aspect or embodiment described herein may, wherever appropriate, be applied to any other aspect or embodiment described herein. Where reference is made to different embodiments or sets of embodiments, it should be understood that these are not necessarily distinct but may overlap.

BRIEF DESCRIPTION OF THE DRAWINGS

Certain preferred embodiments of the invention will now be described, by way of example only, with reference to the accompanying drawings, in which.

DETAILED DESCRIPTION

Figure 1:
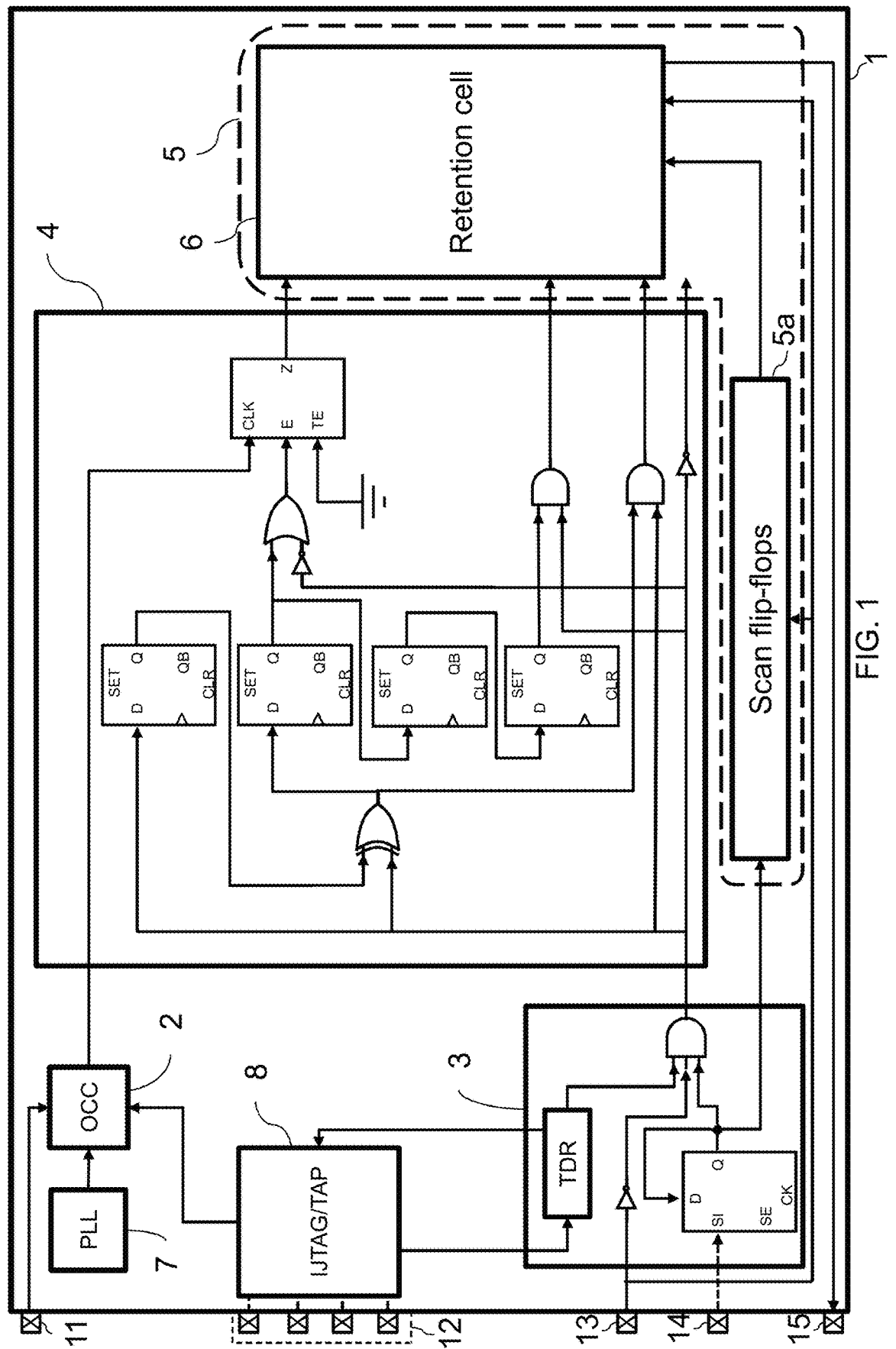
FIG. 1 is a schematic diagram of an integrated-circuit chip embodying the invention showing a retention cell in a scan chain and on-chip circuitry for outputting save, clock and restore signals to the retention cell for testing the retention cell.

FIG. 1 shows an integrated-circuit chip 1 comprising a save-restore type retention cell 6 and on-chip circuitry for generating save, clock and restore signals for output to the retention cell 6 in response to a signal from an off-chip testing tool. The on-chip circuitry of the integrated circuit 1 comprises an on-chip clock controller (OCC) 2, test enable logic 3, retention test sequence generation logic 4, a scan chain 5 formed of a set of non-retention scan flip-flops 5*a* and the retention cell 6, a phase locked loop (PLL) 7, and test access port (TAP) logic 8. The integrated circuit chip 1 also includes input/output pins 11-15, associated with these components 2-8. (A pin may refer to a metal pin of a packaged chip, or to a pad or other connection point on the chip 1, suitable for establishing an electrical connection to another component). The chip 1 may also have other components, such as processors, memory, radio circuitry, interfaces, other peripherals, etc. which are omitted from FIG. 1 for ease of understanding. It may be a system-on-chip (SoC).

Although the integrated circuit 1 as illustrated in FIG. 1 exhibits only a single retention cell 6, it will be appreciated that this is merely exemplary and the integrated circuit 1 could include significantly more retention cells than this, e.g. ten, one hundred, one thousand, ten thousand or more, some or all of which may be included within the scan chain 5 or within other scan chains that are not shown in FIG. 1.

The on-chip clock controller (OCC) 2 is used to provide a clock signal for use when testing the retention cell 6 (and optionally when testing other components). It can do so based on a scan clock signal received from an off-chip test tool at a clocking pin 11 and/or a clock signal output by the on-chip PLL 7. As will be explained in more detail below, the clock signal output by the on-chip clock controller 2 is provided to the retention test sequence generation logic 4 which can use it to generate and output a special clock signal to the retention cell 6 for testing purposes.

The test enable logic 3 is used to generate a test-enable signal used to initiate a scan chain testing process in which retention cell testing is performed. It will be appreciated that the scan chain testing process may comprise operating the chip 1 in the scan-shift mode and the scan-capture mode. As will be explained in more detail below, the test enable logic 3 is arranged to output a low value to the retention test sequence generation logic 4 while retention testing is disabled (i.e. when the chip 1 is operating in a normal functional mode or during a scan chain testing process without retention cell testing) and to output a high value when the chip 1 is in scan-chain testing mode in which retention testing (and optionally other testing) is to be performed.

The retention test sequence generation logic 4 is configured to generate a sequence of save, clock, and restore pulses, in a particular pattern, for output to the retention cell 6, in response to receiving the test-enable signal from the test enable logic 3 and a clock signal from the on-chip clock controller 2.

The scan chain 5 contains a series of scan flip-flops 5*a* of the integrated circuit 1. The scan flip-flops 5*a* can be connected sequentially as part of a scan chain testing process, so as to form a single shift register. This configuration is activated in response to a SCAN_ENABLE signal 502 received at a scan-enable pin 13 of the integrated circuit 1 from off-chip testing equipment. In the scan chain testing process, the off-chip testing tool provides a sequence of input values (i.e. scan data) at a scan input (SI) pin 14 of the integrated circuit 1. When the SCAN_ENABLE signal 502 received at the pin 13 is active, data provided at the scan input pin 14 is clocked into the scan flip-flops 5*a* and retention cell 6 through the scan chain 5 in a scan-shift mode. The scan chain 5 can then be set to a scan-capture mode, by lowering the SCAN_ENABLE signal 502, in which the scan flip-flops 5*a* and retention cell 6 are disconnected from the chain and the scan flip-flops 5*a* may instead be connected to respective functional circuitry. After a single capture clock pulse, the chip 1 is then returned to the scan mode and the state of every flip-flop in the scan chain 5, including the retention cell 6, can then be read out at a scan output pin 15 in the scan-shift mode.

An automatic test pattern generation (ATPG)-based tool can generate input data and the output data can be checked to determine whether the chip 1 is functioning correctly— e.g. to identify stuck-at faults. Multiple different tests may be performed by clocking in and out different successive scan data. At least some of the testing may test the actual functioning of the scan flip-flops 5*a* themselves, as well as combinational and/or sequential logic to which the scan flip-flops 5*a* are connected during scan-capture mode, as well as in the normal functional mode of the chip 1.

Although for simplicity only a single scan chain 5 is illustrated in FIG. 1, it will be appreciated that multiple scan chains may be present. The scan chain 5 may also support scan compression and be formed as a plurality of sub-chains driven by an on-chip decompressor.

Figure 2:
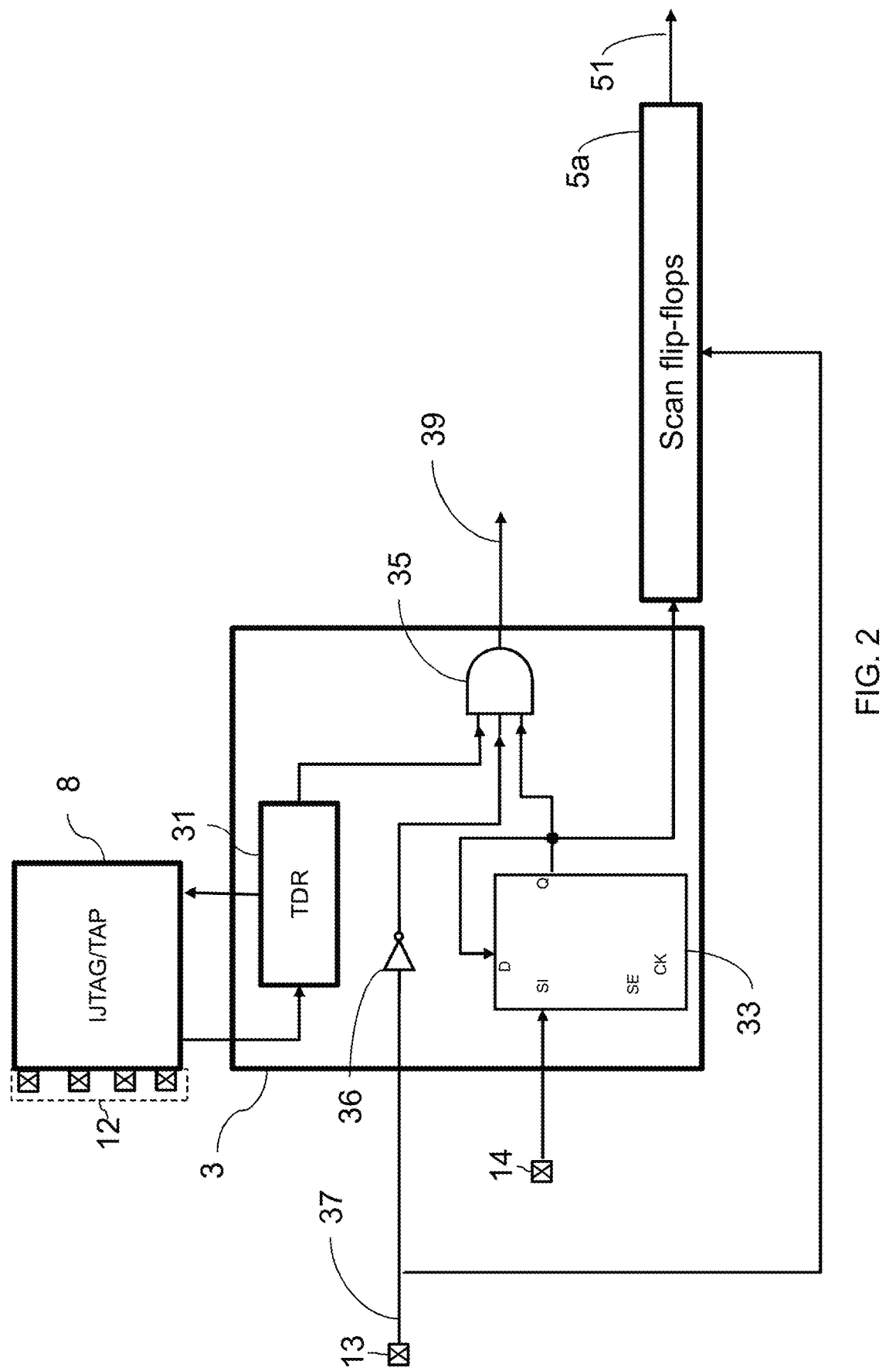
FIG. 2 is a close-up schematic diagram of the chip providing more detail of circuitry for generating an enable signal to control the testing of the retention cell.

FIG. 2 shows the test enable logic 3 in more detail. The test enable logic 3 comprises a single-bit test data register (TDR) 31 arranged to receive an input from the test access port (TAP) logic 8 of the integrated circuit. The TAP logic 8 is a logic block that operates according to the Joint Test Action Group (JTAG) standard, and is arranged to provide a test data output to the test data register 31 of the test enable logic 3 based on inputs received from an off-chip testing tool at the I/O pins 12 of the TAP logic 8. The test data output to the test data register 31 indicates whether or not retention cell testing is to be included out as part of an ATPG run performed by the off-chip testing tool.

In response to the binary signal from the TAP logic 8, the test data register 31 is configured to output a corresponding value to a first input of a three-input AND gate 35, which, when active, outputs a test-enable signal over a test-enable line 39 to the retention test sequence generation logic 4. The test data register 31 outputs a high value to the three-input AND gate 35 when retention cell testing is to be performed, and a low value otherwise.

The second input of the three-input AND gate 35 is arranged to receive a SCAN_ENABLE signal 502 over a scan-enable line 37 received at the scan-enable pin 13 of the integrated circuit 1 from an off-chip testing tool, for initiating the scan chain testing process. The scan-enable line 37 is set low for scan-capture operation of the integrated circuit 1, but is set high for clocking ATPG test data in and out of the scan chain 5 in the scan-shift mode. The scan-enable line 37 is connected to the second input of the three-input AND gate 35 via an inverter 36 such that the input to the three-input AND gate 35 is low during the scan-capture process.

The scan-chain testing is controlled at least in partly using a control-bit scan flip-flop 33, which is coupled to an end one of the scan flip-flops 5a such that the control-bit scan flip-flop 33 can also be regarded as forming part of the scan chain 5 when the chip 1 is in the scan-shift mode. During scan-chain testing of a scan chain of an integer N non-retention flip-flops 5a, a sequence of N input bits (the input vector) is provided at the scan input (SI) pin 14 by an off-chip testing tool and each bit is successively received through the control-bit scan flip-flop 33. The control-bit scan flip-flop 33 outputs these bits to the rest of the scan chain 5 in sequence during a scan-in process in the scan-shift mode in which the N values are passed down the scan chain 5 over N clock cycles, to set each flip-flop of the scan chain 5, including the principal flip-flop of the retention cell 6, to a known value.

Once the sequence of N values has been clocked into the scan chain 5, the scan-enable line 37 is de-asserted, causing the multiplexers of the scan flip-flops to receive inputs from respective functional circuitry rather than from the scan chain 5, and a single clock cycle (referred to as the capture pulse) is issued to the clock inputs of the scan flip-flops 5a in the scan-capture mode. Each scan flip-flop 5a of the scan chain 5 will therefore capture a new value during this step. After the capture pulse, the scan-enable line 37 is re-asserted, and a scan-out process is performed in the scan-shift mode, in which the value held on each flip-flop of the scan chain 5, including the retention cell 6, is serially output to the off-chip test tool from the scan output pin 15. The sequence of output values may then be compared to an expected sequence to detect any manufacturing defects in the chip 1.

Advantageously, the chip 1 also allows the retention function of the retention cell 6 to be tested when performing this scan chain testing. This retention function testing can be selectively enabled or disabled based on an input to the TAP logic 8 as described above, and based on a control bit in the test vector as described below. The retention operation of other retention cells may also be tested in the same process if the chip 1 has a plurality of retention cells located within the scan chain 6.

When such retention testing is to be performed, a first value is loaded to the principal flip-flop of each retention cell, and this is then saved to the balloon latch of the retention cell prior to the capture clock pulse. Each retention cell 6 may be arranged to receive a value from functional circuitry, when in the scan-capture mode, that depends on a value stored in one or more scan flip-flops 5a of the scan chain 5 (e.g. by having the output of a scan flip-flop 5a connect directly to the data input of the retention cell 6, or by being connected through some combinatorial logic). In this way, the test vector can be constructed such that the capture pulse clocks an opposite binary value into the principal flip-flop from the first value, by arranging the test vector such that this opposite value is received from functional circuitry connected to the data input of the principal flip-flop of the retention cell 6 during the scan-capture process. If the retention cell 6 is operating correctly (i.e. without manufacturing defects), the original first value is then restored to the principal flip-flop of the retention cell after the capture pulse, but prior to the scan-out process commencing. If the save and restore functionality is broken, the opposite value may still be present. By performing a save operation prior to the capture pulse, following by a restore operation before the scan out process, the value that is clocked out of the retention cell 6 during the scan-out can indicate whether or not the balloon latch is functioning correctly. This allows the retention cell 6 to be tested as part of a larger scan-chain testing process.

The final bit of the input vector is a control bit that is loaded into the control-bit scan flip-flop 33. When retention cell testing is to performed, this bit is set to one. The control-bit scan flip-flop 33 will then output a high value to the third input of the three-input AND gate 35 of the test enable logic 3, causing retention cell testing to be enabled. In the case that a scan-chain test is intended to test only some of the non-retention flip-flops 5a (and optionally only the principal flip-flop of the retention cell 6), then this control bit can be set to zero and the test-enable line 39 output from the three-input AND gate 35 will be low.

When the three-input AND gate 35 receives a high input from the control-bit scan flip-flop 33, and from the TDR 31, and when SCAN_ENABLE is low, all three inputs to the three-input AND gate 35 are high, causing the three-input AND gate 35 to assert the test-enable line 39 to the retention test sequence generation logic 4. The value of this line 39 is thus set high when retention cell testing is to be performed, and is set low otherwise such that no retention cell testing takes place.

Figure 3:
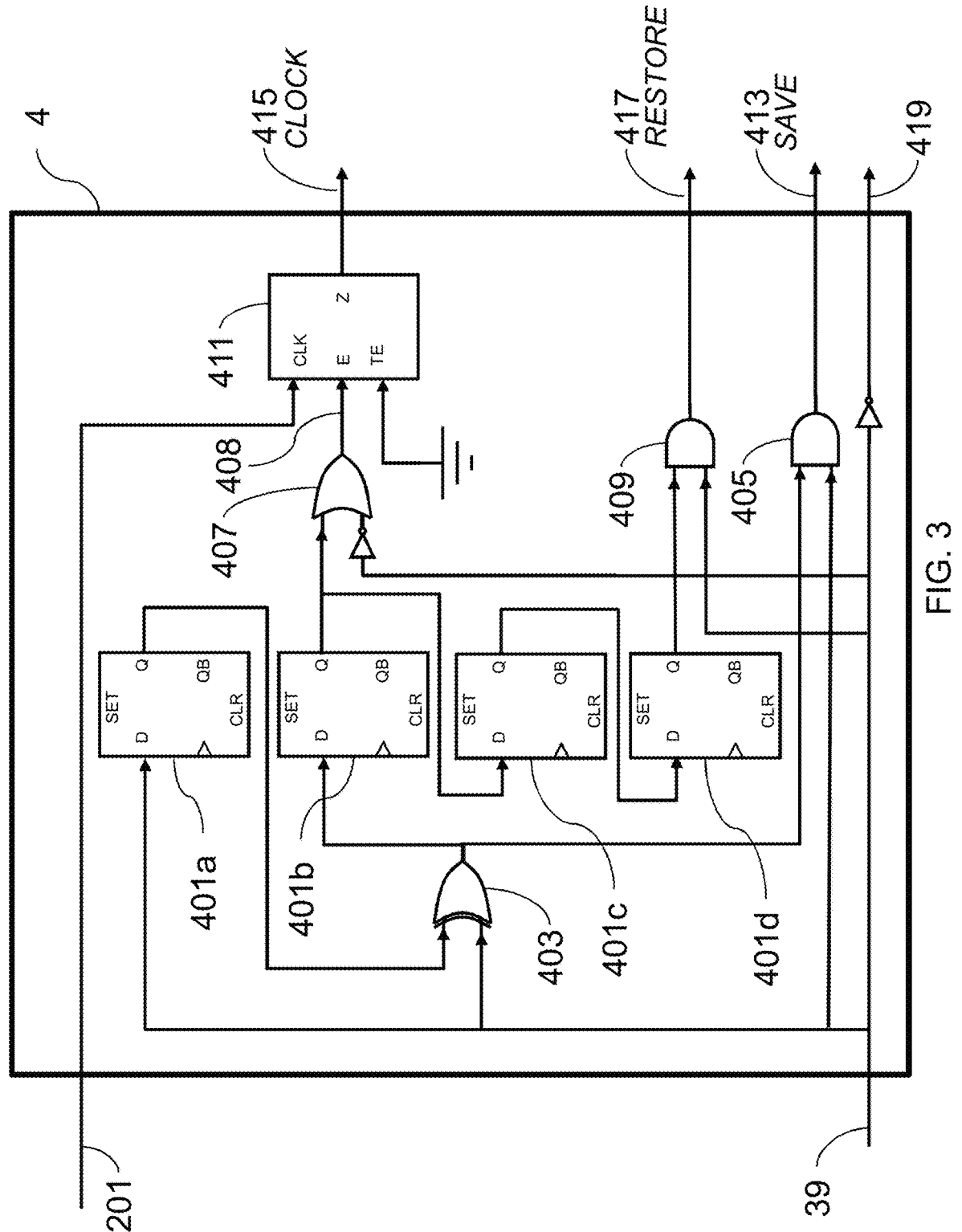
FIG. 3 is a close-up schematic diagram of the chip providing more detail of the retention-test sequence generation logic for generating the save, clock and restore signals.

The retention test sequence generation logic 4 is shown in more detail in FIG. 3. It has a first input line 201 from the OCC output clock 2 for receiving an OCC_CLOCK_OUT signal 501, and a second input from the test-enable line 39 output by the test enable logic 3. As set out in more detail in the following, the retention test sequence generation logic 4 is arranged to output, to the retention cell 6:

a SAVE signal 507 over a save line 413 to the SAVE input of the retention cell 6;

a RETENTION_CLOCK 509 signal (providing the capture clock for scan-chain testing) over a retention-clocking line 415 to the CLOCK input of the retention cell 6; and a RESTORE signal 510 over a restore line 417 to the RESTORE input of the retention cell 6.

As outlined above, the test enable logic 3 is configured to assert the test-enable line 39 to the retention test sequence generation logic 4 when retention testing is to be performed. This test-enable signal is provided to the first inputs of a first AND gate 405, a second AND gate 409, and an XOR gate 403, as well as to the input of a first delay flip-flop 401a of the retention test sequence generation logic 4.

An inverse of the test-enable line 39 state is also output on a line 419 that may be coupled to the RETN input (which may sometimes be referred to as a SLEEP input) of any single-pin retention cells (i.e. retention cells of a type that does not have separate SAVE and RESTORE inputs), for supporting scan-chain testing of such single-pin cells alongside save-restore type retention cells such as the retention cell 6.

When the test-enable line 39 from the test enable logic 3 goes high, a high value is received at the first input of the XOR gate 403, which differs from the low-value received at its second input from the first delay flip-flop 401a. As the two inputs to the XOR gate 403 are different, the XOR gate 403 provides a high-valued output. This output is received at the second input of the first AND gate 405, matching the high-valued test-enable signal received at its first input. Once both inputs of the first AND gate 405 are similarly valued, it outputs a high-valued SAVE signal 413 to the retention cell 6. This causes the balloon latch of the retention cell 6 (contained within balloon latch logic 62) to store the output of the principal flip-flop 61 of the retention cell 6. After a next clock pulse from the OCC 2, the first delay flip-flop 401a of the retention test sequence generation logic 4 outputs a high value to the second input of the XOR gate 403, which matches the high-valued test-enable signal received at its second input. Once the two inputs to the XOR gate 403 are identical, the output from the XOR gate 403 goes low. This causes the first AND gate 305 to stop asserting the SAVE input 413 of the retention cell 6, as the values received at its two inputs are no longer the same.

The output of the XOR gate 403 is also provided to the data input of a second delay flip-flop 401b. In response, after a next clock pulse from the OCC 2, the second delay flip-flop 401b provides a high-valued output to the first input of an OR gate 407, which is arranged to receive the inverse of the test-enable line 39 from the test enable logic 3 at its second input. As the first input of the OR gate 407 received from the second delay flip-flop 401b goes high, i.e. is different to the inverted test-enable signal at its second input, the OR gate 407 outputs a high-valued CLOCK_ENABLE signal 508 over an internal clock-enable line 408 to a capture-pulse-generating integrated clock gating (ICG) cell 411.

The CLOCK_ENABLE signal 508 controls the generation of the capture clock pulse by allowing the capture-pulse-generating ICG cell 411 to be clocked by the OCC_CLOCK_OUT signal 501 received over the line 201 from the on-chip clock controller (OCC) 2. In response, the ICG cell 411 outputs a retention test clock signal 415 (as a capture pulse) to the retention cell 6 when both the clock-enable line 408 and the OCC clock input line 201 are asserted. This allows a retention test clock output, RETENTION_CLOCK 509, to be provided in the form of a single square wave clock pulse during the scan-capture process, while SCAN_ENABLE 502 is low. The first and second delay flip-flops 401a and 401b ensure that the rising edge of the retention test clock signal is not received at the retention cell 6 until after the SAVE signal 507, output to the retention cell 6 over the save signal line 413 by the first AND gate 405, has been asserted and de-asserted.

The inverted test-enable signal received by the OR gate 407 advantageously ensures that the ICG cell 411 is not enabled while the SAVE pulse is being output, as the inverted test-enable signal and the low-valued output of the second delay flip-flop 401b are like-valued at this time.

The low-valued output of the XOR gate 403 is also received at the input of the second delay flip-flop 401b, causing it to output low after a next OCC clock pulse. At this point, the first input of the OR gate 407 received from the second delay flip-flop 401b goes low, matching the inverted test-enable signal at its second input. This causes the clock-enable line 408 into the capture-pulse-generating ICG cell 411 by the OR gate 407 to become low-valued, effectively switching the ICG cell 411 off, ensuring that the retention test clock signal RETENTION_CLOCK 509, output to the retention cell 6, includes only a single capture clock pulse while the SCAN_ENABLE signal 37 is low in the scan-capture mode.

The second delay flip-flop 401b also provides an output to a third delay flip-flop 401c, which is connected to a fourth delay flip-flop 401d. This sequence of delay flip-flops allows the output of the second delay flip-flop 401b to be reproduced by the fourth delay flip-flop 401d after two further OCC clock pulses. The fourth delay flip-flop 401d is configured to provide an output to the first input of an AND gate 409, which is arranged to receive the test-enable signal from the test enable logic 3 at its second input. When the input received from the fourth delay flip-flop 401d goes high, the AND gate 409 outputs a high valued RESTORE signal 510 to the RESTORE input line 417 of the retention cell 6. This causes the balloon latch logic 62 of the retention cell 6 to restore the value held on its principal flip-flop 61 of the retention cell 6 to the value held in the balloon latch within the balloon latch logic 62.

The third delay flip-flop 401c is arranged so as to ensure that the timing of the RESTORE signal 510, output by the test sequence generation logic 4 over the restore line 417, is correct. In particular, the third delay flip-flop 401c ensures that the retention test clock 415 is pulsed only strictly in between asserting the save line 413 and the restore line 417, and hence that there is no overlap between these signals. This allows the retention test sequence generation logic 4 to avoid outputting overlapping SAVE, RESTORE and CLOCK pulse to the retention cell 6, which could result in an error on the real chip 1, and a simulation violation during a chip design process.

Figure 4:
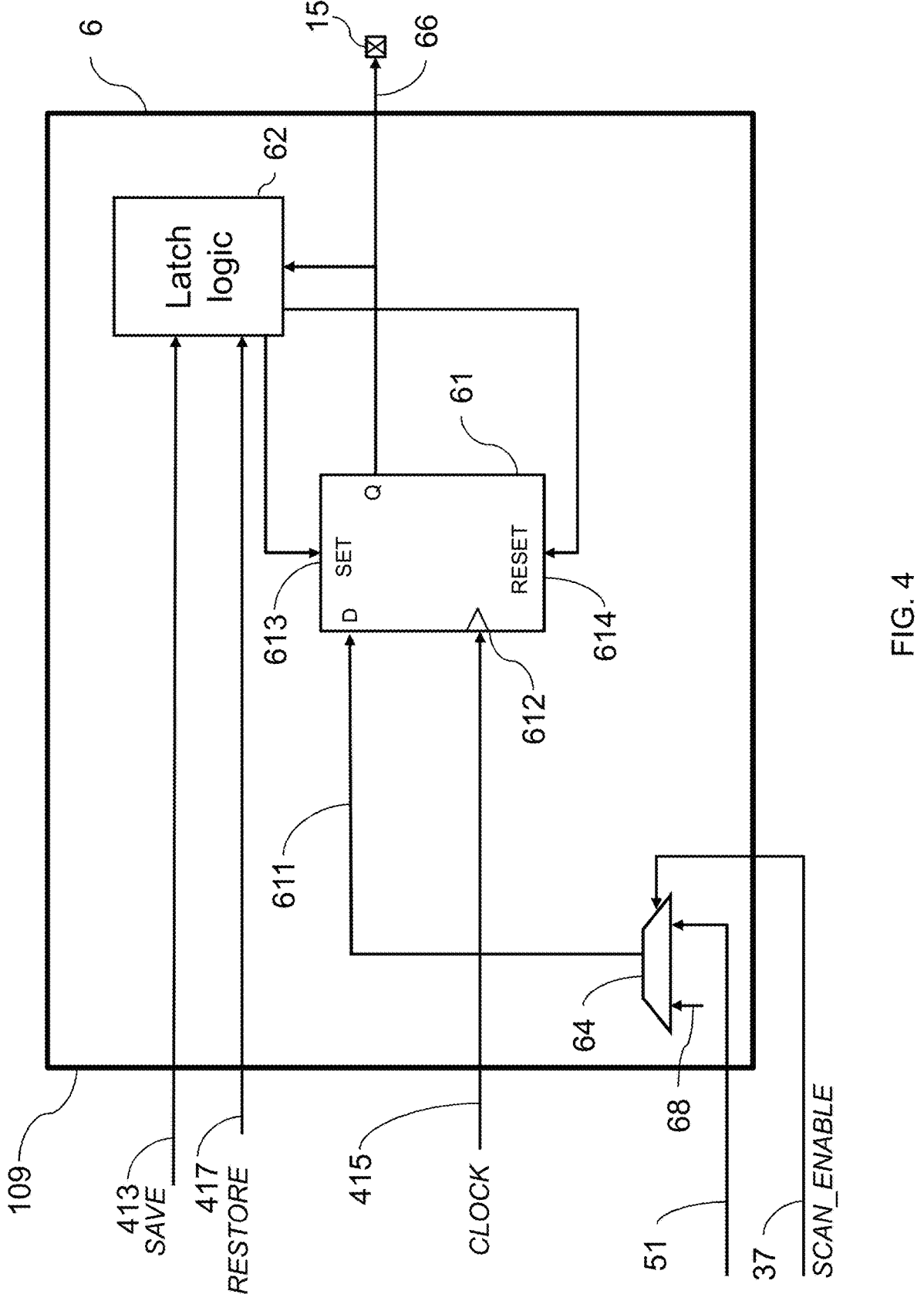
FIG. 4 is a close-up schematic diagram of the chip providing more detail of the retention cell.

The retention cell 6 is shown in more detail in FIG. 4. It contains a principal D-type flip-flop 61 and separate balloon latch logic 62 (which includes a balloon latch, and combinatorial logic for setting or resetting the principal flip-flop 61, in dependence on a value stored in the balloon latch, in response to a restore signal), as well as a multiplexer 64 which acts to provide input values to the data input of the principal flip-flop 61. The multiplexer 64 has a first input 68 that can be connected to functional circuitry of the integrated circuit 1 for receiving data into the principal flip-flop 61 during normal functional operation (which may include from one or more of the scan flip-flops 5a), as part of the functional logic of the integrated circuit 1. The multiplexer 64 also has a second input for receiving the data output 51 of the preceding flip-flop in the scan chain 5. The multiplexer 64 is controlled by the SCAN_ENABLE signal 508, received over the scan-enable line 37. When the SCAN_ENABLE signal 508 is asserted (e.g. during the scan-in and scan-out processes in the scan-shift mode), the output 51 of the preceding flip-flop in the scan chain 5 is provided to the first multiplexer 63.

The principal flip-flop 61 is powered by a first power domain of the integrated circuit. This power domain may be powered down during a low-power state. The balloon latch logic 62 comprises a balloon latch and functional logic (not shown in detail in FIG. 4 for simplicity of illustration) that are powered by a separate power domain, which may be an "always-on" power domain, or at least more-on than the first power domain. As the principal D-type flip-flop 61 and the balloon latch logic 62 are in separate power domains, the balloon latch logic 62 is able to remain active to retain a value even when the first power domain is switched off and the principal flip-flop 61 is not active.

The principal flip-flop 61 is arranged to receive data and clock inputs from the retention test sequence generation logic 4, and from the scan chain 5, and from the scan-enable pin 13. More particularly, it is arranged to receive a first value at its data D input 611 from the multiplexer 64, and a second value at a clock input 612 from the capture-pulse-generating ICG cell 411 of the test sequence generation logic 4. Based on these inputs, the principal flip-flop 61 provides a clocked output value on its Q output line 66. This output line 66 is coupled to the scan output pin 15 of the integrated circuit 1 for clocking out data from the scan chain 5 during a scan-out process.

The output line 66 from the principal flip-flop 61 is also provided to the latch logic 62, which is connected to the retention test sequence generation logic 4 to allow for testing of the retention cell 6. During retention cell testing, the SAVE signal 507 is received over the save line 413 at the balloon latch logic 62 from the retention test sequence generation logic 4; this causes the output value 66 of the principal flip-flop 61 to be saved to a balloon latch of the balloon latch logic 62, where it can be stored as long as the voltage source to the balloon latch logic 62 is active.

The balloon latch logic 62 is also arranged to receive the RESTORE signal 510 over the restore line 417 from the retention test sequence generation logic 4. During a restore operation, when this line 417 is asserted, the balloon latch logic 62 asserts either the SET input 613 or the RESET input 614 of the principal flip-flop 61, depending on whether the value held on the balloon latch is high (i.e. binary one) or low (i.e. binary zero), respectively, when the RESTORE signal 510 is received. Once the value stored on the balloon latch has been restored to the principal flip-flop 61 by means of the SET input 613 or RESET input 614, this value is again provided at the Q output 66 and hence can be available at the scan output pin 15.

Figure 5:
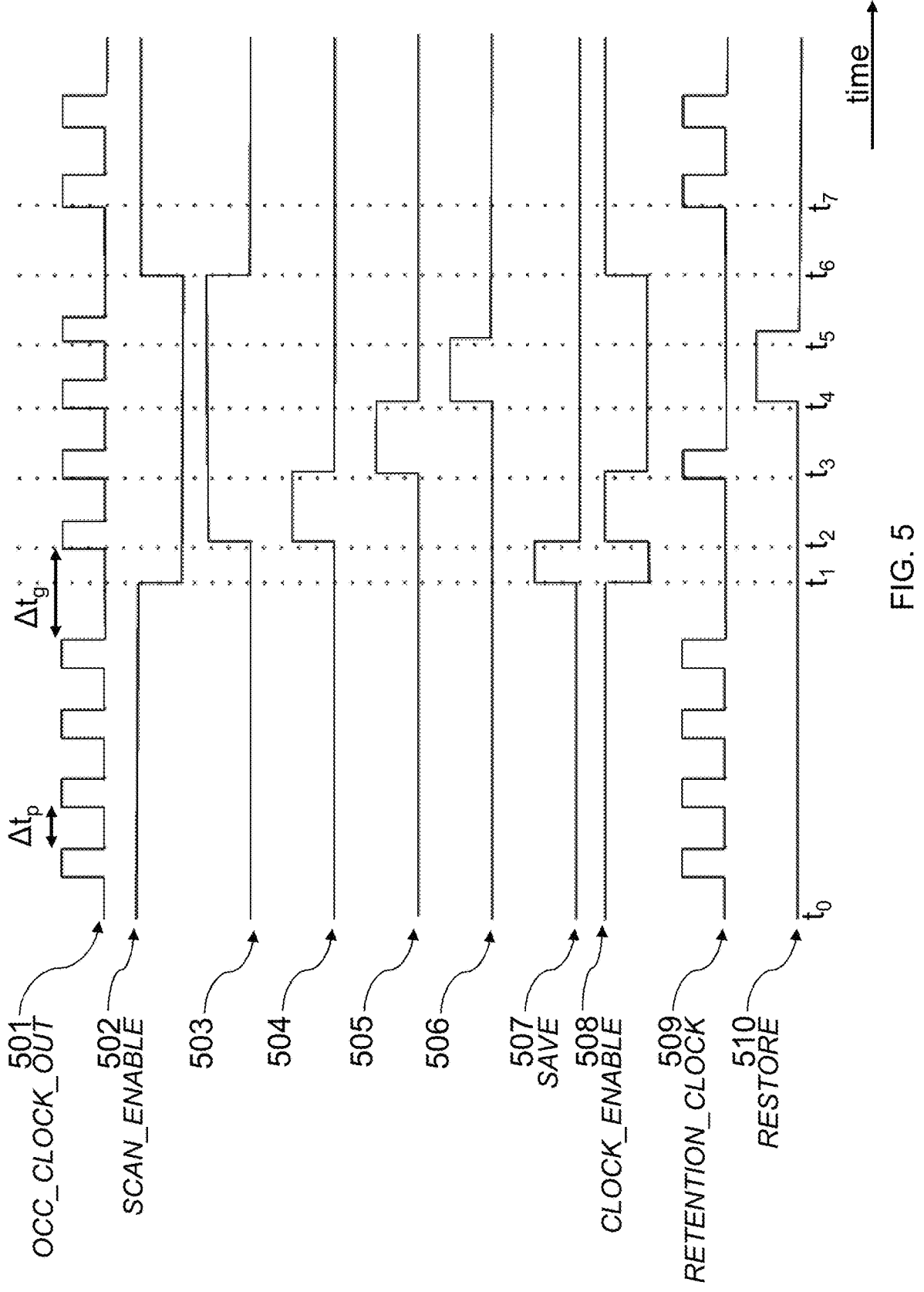
FIG. 5 is a timing diagram of signals generated by retention test sequence generation logic according to the present invention.

FIG. 5 is a timing diagram showing the process of generating these SAVE 507, RETENTION_CLOCK 509 and RESTORE 510 signals by the retention test sequence generation logic 4 for output to the retention cell 6. As will be explained in more detail below, the timing diagram shows the status of outputs from various components of the integrated circuit 1 from an initial time $t_0$, prior to retention cell testing, to a time $t_8$, after the value stored by the balloon latch logic 62 has been restored to the principal flip-flop 61 of the retention cell.

The OCC_CLOCK_OUT signal 501 is the clock signal generated by the on-chip clock controller (OCC) 201. It can be seen that OCC_CLOCK_OUT takes the form of a square wave comprising groups of four clock pulses separated by a first time value $\Delta t_p$, the groups of pulses being separated by a separate time value $\Delta t_g$. It should be noted that the grouping of, and separation between, pulses and groups in FIG. 5 is merely exemplary and that any desired pulse timings may be used in practice.

The SCAN_ENABLE signal 502 is provided to the test enable logic 3 at the scan-enable pin 13 by an off-chip testing tool. It can be seen that at to the SCAN_ENABLE signal 37 has already been set high, for clocking data into the scan chain 5 during a scan-in process. At time $t_1$, once a test vector has been clocked in, the off-chip testing tool brings SCAN_ENABLE signal 37 low at time $t_1$. This can enable the three-input AND gate 35 to output a test-enable signal over the test-enable line 39 to the retention test sequence generation logic 4 for performing retention cell testing, assuming the TAP input and control bit are set to enable this. The state of the SCAN_ENABLE signal 37 remains low during the save and restore operation between $t_1$ and $t_6$, at which point the SCAN_ENABLE signal 37 is set high by the off-chip testing tool, causing the test-enable signal provided to the retention test sequence generation logic 4 to go low, indicating that the save and restore operation has been completed, and that a scan-out process can commence.

Curve 503 shows the signal output by the first delay flip-flop 401a. At $t_0$, the first delay flip-flop 401a outputs low. However, shortly after $t_1$ the test-enable signal is received at the data input of the first delay flip-flop 401a, causing it to output high when the next clock pulse is received at $t_2$. The output of the first delay flip-flop 401a remains high until the test-enable line 39 to its data input goes low at time $t_6$.

Curve 504 shows the signal output by the second delay flip-flop 401b. At $t_0$, the second delay flip-flop 401b outputs low. However, shortly after $t_1$ the test-enable signal is received at the XOR gate 403, from which it is provided to the data input of the second delay flip-flop 401b. This causes the second delay flip-flop 401b to output high at time $t_2$. This output remains high until the XOR gate 403 receives a high input from the first delay flip-flop 401a at time $t_3$. This causes the XOR gate to output low to the second delay flip-flop 401b, causing the output of second delay flip-flop 401b to become low from time $t_3$ onwards.

Curve 505 shows the signal output by the third delay flip-flop 401c. At $t_0$, the third delay flip-flop 401b outputs low. At time $t_3$, the third delay flip-flop 401c receives a high input from the second delay flip-flop 401b, causing the third delay flip-flop 401c to output high. This output remains high until the input from the second delay flip-flop 401b goes low, causing the third delay flip-flop 401c to output low from time $t_4$ onwards.

Curve 506 shows the signal output by the fourth delay flip-flop 401d. At $t_0$, the fourth delay flip-flop 401d outputs low. At time $t_4$, the fourth delay flip-flop 401d receives a high input from the third delay flip-flop 401c, causing the fourth delay flip-flop 401d to output high. This output remains high until the input from the third delay flip-flop 401c goes low, causing the fourth delay flip-flop 401d to output low from time $t_5$ onwards.

The SAVE signal 507 is output by the AND gate 405 of the retention test sequence generation logic 4. At time $t_0$, both inputs to the AND gate 405 are low, such that the SAVE signal 507 output by the AND gate 405 is low. At time $t_1$, the test-enable signal received at the AND gate 405 goes high when the SCAN_ENABLE signal is set low by the off-chip testing tool. At the same time, the XOR gate 403 outputs high to the second input of the AND gate 405, causing the SAVE signal 507 to go high at time $t_1$. When the XOR gate 403 outputs low in response to the output of the first delay flip-flop 401a at time $t_2$, the inputs of the AND gate 405 differ, and hence the SAVE signal 507 goes low at time $t_2$, and remains low after this.

The CLOCK_ENABLE signal 508 is output on the retention-test clock-enable line 408 output to the capture-pulse-generating ICG cell 411 by OR gate 407. The retention test clock signal is high at to as a result of the high-valued inverted test-enable signal received at the OR gate 407. When retention cell testing is enabled at time $t_1$, the inverted test-enable signal received at the OR gate 407 goes low, causing the retention test clock signal to go low in the time window in which the SAVE signal 507 is high. At time $t_2$ however, the output from the second delay flip-flop 401b to the OR gate 407 goes high, causing the CLOCK_ENABLE signal 508 from the OR gate 407 to be set high. The CLOCK_ENABLE signal remains high until the output from the second delay flip-flop 401b to the OR gate 407 goes low at time $t_3$. At this time, the CLOCK_ENABLE signal 508 becomes low, and remains low until after the save and restore process is completed at time $t_6$.

The RETENTION_CLOCK signal 509 is the retention test clock signal output by the capture-pulse-generating ICG cell 411 of the retention test sequence generation logic 4. Prior to retention testing, the CLOCK_ENABLE signal 508 at the ICG cell 411 is high, and the clock signal OCC_CLOCK_OUT 501 is received at the data input of the ICG cell 411. Based on these inputs, the RETENTION_CLOCK signal 509 replicates the OCC_CLOCK_OUT signal 501 until the CLOCK_ENABLE signal 508 goes low at time $t_1$. After the CLOCK_ENABLE signal 508 goes high at time $t_2$, the ICG cell 411 is able to output a retention test clock signal in response to a change in the clocking signal 201 received at its clock input. This allows the retention test clock signal to be controlled to output a single capture clock pulse at time $t_3$, after the SAVE signal has been output to the retention cell 6. As the CLOCK_ENABLE output is low between $t_3$ and $t_6$, the value of the retention test clock signal is unaffected by changes in the clock signal 201 for the duration of the retention cell testing. Once testing is complete at time $t_6$, the retention test clock signal is high-valued, and hence the retention test clock output again matches the clock signal 201.

The RESTORE signal 510 is output by the AND gate 409 of the retention test sequence generation logic 4. At time $t_0$, both inputs to the AND gate 405 are low. At time $t_0$, both inputs to the AND gate 409 are low, such that the RESTORE signal 510 is low. At time $t_1$, the test-enable signal received at the AND gate 409 goes high when the SCAN_ENABLE signal 502 is set low by the off-chip testing tool. However, its second input remains low until the output of the fourth delay flip-flop 401$d$ goes high at time $t_4$. This output remains high until the input from the fourth delay flip-flop 401$d$ goes low at time $t_5$, causing the RESTORE signal 510 to go low from the time this signal is received at the AND gate 409 onwards.

Thus, according to the process shown in FIG. 5, testing of the correct saving to and restoring of a value from the balloon latch of the balloon latch logic 62 of the retention cell 6 can be performed as part of an ATPG-based scan-chain testing than can include other non-retention flip-flops 5$a$, by causing a value to be saved in the balloon latch strictly prior to a capture pulse being generated, and then restored strictly after the capture pulse but before the scan-out process is performed. The scan-chain output vector includes a restored value from the retention cell 6 can therefore indicate whether the retention cell 6 is functioning correctly. This allows the retention cell 6 to be tested as part conventional ATPG testing in the scan mode.

It will be appreciated by those skilled in the art that the invention has been illustrated by describing one or more specific embodiments thereof, but is not limited to these embodiments; many variations and modifications are possible, within the spirit and scope of the disclosure and the accompanying claims.

I claim:

1. An integrated-circuit chip comprising:
a plurality of scan flip-flops; and
a retention cell;
wherein the integrated-circuit chip is configured to have a scan-capture mode, in which the plurality of scan flip-flops and the retention cell are connected to respective functional circuitry of the integrated-circuit chip, and to have a scan-shift mode, in which the plurality of scan flip-flops and the retention cell are connected so as to form a scan chain for use during scan-chain testing of the integrated-circuit chip; and wherein the integrated-circuit chip further comprises on-chip test circuitry arranged to generate and output a save signal, a clock signal, and a restore signal to the retention cell, for testing the retention cell during scan-chain testing of the integrated-circuit chip.

2. The integrated-circuit chip of claim 1, wherein the integrated-circuit chip is configured to receive a test data from outside the integrated-circuit chip and to load the test data to the plurality of scan flip-flops and the retention cell.

3. The integrated-circuit chip of claim 1, wherein the retention cell comprises a principal latch and a retention latch, wherein the principal latch and the retention latch are in different respective power domains.

4. The integrated-circuit chip of claim 3, wherein the principal latch is provided by a D-type flip-flop and the retention latch is a balloon latch.

5. The integrated-circuit chip of claim 1, wherein the retention cell comprises a save input arranged to receive the save signal from the on-chip test circuitry over a save line, and a restore input arranged to receive the restore signal from the on-chip-test circuitry over a restore line, wherein the restore input is distinct from the save input, and wherein the restore line is distinct from the save line.

6. The integrated-circuit chip of claim 1, further comprising a scan-enable pin for receiving a scan-enable signal from off-chip test equipment, and wherein the integrated-circuit chip is configured to switch between the scan-capture mode and the scan-shift mode at least partly in dependence on a state of the scan-enable pin.

7. The integrated-circuit chip of claim 1, wherein the test circuitry is configured to output the save signal, and then the clock signal, and then the restore signal, to the retention cell.

8. The integrated-circuit chip of claim 1, wherein the save signal is a single save pulse, the clock signal is a single clock pulse, and the restore signal is a single restore pulse.

9. The integrated-circuit chip of claim 1, wherein the save pulse, the clock pulse and the restore pulse are non-overlapping in time.

10. The integrated-circuit chip of claim 1, wherein the on-chip test circuitry is configured to output the save, clock and restore signals when the integrated-circuit chip is in the scan-capture mode and in response to the integrated-circuit chip switching from the scan-shift mode to the scan-capture mode during scan-chain testing.

11. The integrated-circuit chip of claim 1, configured such that the clock signal causes a principal latch of the retention cell to receive a value that is, or that depends on, a value stored in a scan flip-flop of the plurality of scan flip-flops, when the integrated-circuit chip is in the scan-capture mode.

12. The integrated-circuit chip of claim 1, further comprising an on-chip clock controller configured to generate a local clock signal for use by the on-chip test circuitry, and wherein the on-chip test circuitry is arranged to receive the local clock signal from the on-chip clock controller and to derive the clock signal for output to the retention cell from the received local clock signal.

13. The integrated-circuit chip of claim 12, wherein the on-chip test circuitry is further configured to use the local clock signal to synchronize the save signal, clock signal and restore signal output by the on-chip test circuitry to the retention cell.

14. The integrated-circuit chip of claim 1, further comprising test-enable circuitry configured to generate a test-enable signal for indicating that retention testing is to be performed during the scan-chain testing, and wherein the test-enable circuitry is configured to output the test-enable signal at least partly in response to a signal received from outside the chip.

15. The integrated-circuit chip of claim 14, wherein the test-enable circuitry is configured to be responsive to a signal received over a test access port of the integrated-circuit chip and/or received as a control bit within test data received at a scan-input pin of the integrated-circuit chip.

16. The integrated-circuit chip of claim 14, wherein the test-enable circuitry comprises a control-bit scan flip-flop arranged to be part of the scan chain and to output data values to the plurality of scan flip-flops and the retention cell in the scan-shift mode, and wherein the integrated-circuit chip is configured to determine whether to issue the save and restore signals to the retention cell at least partly in dependence on a value stored in the control-bit scan flip-flop.

17. The integrated-circuit chip of claim 1, comprising a plurality of retention cells, each arranged to receive the save, clock and restore signals from the on-chip test circuitry.

18. The integrated-circuit chip of claim 1, wherein the retention cell is at an end of the scan chain when in the scan-shift mode, optionally in a sequence with one or more further retention cells.

19. A method of operating an integrated-circuit chip, wherein the integrated-circuit chip comprises:

a plurality of scan flip-flops;

a retention cell; and on-chip test circuitry configured to generate and output save, clock and restore signals to the retention cell, the method comprising, during a scan-chain testing of the integrated-circuit chip:

operating the integrated-circuit chip in a scan-shift mode, in which the plurality of scan flip-flops and the retention cell are connected so as to form a scan chain;

operating the integrated-circuit chip in a scan-capture mode, in which the plurality of scan flip-flops and the retention cell are connected to respective functional circuitry of the integrated-circuit chip; and using the on-chip test circuitry to generate and output a save signal, a clock signal and a restore signal to the retention cell.

20. The method of claim 19, wherein the scan-chain testing comprises automatic test pattern generation (ATPG)-based testing.

\*　\*　\*　\*　\*